United States Patent
Kwak

(10) Patent No.: US 8,364,913 B2
(45) Date of Patent: Jan. 29, 2013

(54) SEMICONDUCTOR MEMORY APPARATUS AND DATA INPUT AND OUTPUT METHOD THEREOF

(75) Inventor: Seung Wook Kwak, Ichon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 231 days.

(21) Appl. No.: 12/846,053

(22) Filed: Jul. 29, 2010

(65) Prior Publication Data

US 2011/0271063 A1 Nov. 3, 2011

(30) Foreign Application Priority Data

Apr. 29, 2010 (KR) .................. 10-2010-0039850

(51) Int. Cl.
*G06F 12/00* (2006.01)
*G06F 13/36* (2006.01)
(52) U.S. Cl. .................. 711/154; 711/E12.001; 710/100
(58) Field of Classification Search .................. 711/154, 711/100, E12.001; 365/189.01, 189.07
See application file for complete search history.

(56) References Cited

U.S. PATENT DOCUMENTS

| 7,139,852 B2 | 11/2006 | LaBerge |
| 2005/0216630 A1 | 9/2005 | Gaskins et al. |
| 2007/0115733 A1* | 5/2007 | Jang et al. ................. 365/189.07 |
| 2008/0162778 A1* | 7/2008 | Choi et al. .................... 711/100 |

FOREIGN PATENT DOCUMENTS

KR 100578219 B1 5/2006

* cited by examiner

*Primary Examiner* — VanThu Nguyen
*Assistant Examiner* — Hai Pham
(74) *Attorney, Agent, or Firm* — William Park & Associates Ltd.

(57) ABSTRACT

A semiconductor memory apparatus includes an input data bus inversion unit configured to determine whether or not to invert a plurality of input data depending upon levels of the plurality of input data, and generate a plurality of conversion data; data input lines configured to transmit the plurality of conversion data; a data recovery unit configured to receive the plurality of conversion data and generate a plurality of storage data; and a memory bank configured to store the plurality of storage data.

20 Claims, 4 Drawing Sheets

SEMICONDUCTOR MEMORY APPARATUS AND DATA INPUT AND OUTPUT METHOD THEREOF

CROSS-REFERENCES TO RELATED APPLICATION

The present application claims priority under 35 U.S.C. §119(a) to Korean application number 10-2010-0039850, filed on Apr. 29, 2010, in the Korean Intellectual Property Office, which is incorporated herein by reference in its entirety as set forth in full.

BACKGROUND

1. Technical Field

The present invention relates to a semiconductor memory apparatus, and more particularly, to a semiconductor memory apparatus which adopts data bus inversion.

2. Related Art

As the data processing speeds of a central processing unit (CPU) and a graphic processing unit (GPU) are gradually increased, semiconductor memory apparatuses capable of operating at a high frequency are needed inevitably. However, in the semiconductor memory apparatuses operating at a high frequency band, the performances of the semiconductor memory apparatuses are likely to deteriorate due to noise of data. In order to solve this problem, the strength of a data driver has been increased or design has been conducted in consideration of a clock margin. Nevertheless, problems are still caused in that noise is generated and misoperation occurs due to an increase in the number of data switching times in the high frequency band.

Accordingly, a data bus inversion (hereinafter, referred to as "DBI") scheme capable of minimizing the number of data switching times has been proposed in the art. In the DBI scheme, what number of data bits among a predetermined number of data bits, for example, 8 data bits induce current flow in transistors of a data output buffer is determined, and if the number of data bits having a logic value which can induce the current flow is large, the number of data bits are inverted so that current consumption can be reduced.

FIG. 1 is a block diagram schematically illustrating the configuration of a conventional semiconductor memory apparatus. A conventional semiconductor memory apparatus 10 includes a data bus inversion determination unit (hereinafter, referred to as a "DBI determination unit") 11 and a data output unit 12. The DBI determination unit 11 is enabled by receiving a mode signal 'mode' which is enabled from a mode register set. The DBI determination unit 11 receives data GIO<0:7> which are transmitted from data input/output lines, and generates a determination signal 'flag' for determining whether to invert data, depending upon the logic levels of the data GIO<0:7>. The data output unit 12 has a plurality of data output drivers DQ1 through DQ8. The data output unit 12 receives the data GIO<0:7> transmitted from the data input/output lines and the determination signal 'flag', and determines whether to output the data by inverting it or passing the data through as is, that is, simply transmitting the data. If the mode signal 'mode' is enabled, the determination signal 'flag' is transferred to a chipset which is connected with the semiconductor memory apparatus 10. Therefore, even though inverted output data are outputted, the chipset can recognize that the data having levels opposite to those of the inverted output data are precise data.

Nonetheless, in the conventional semiconductor memory apparatus, since whether to output the data by inverting or non-inverting (i.e. transmitting) them is determined and data can be inverted only in the data output unit 12, a problem is caused in that current consumption is substantial due to toggling of the data input/output lines for transmitting data. Also, in the conventional art, due to an interfacing problem which is likely to occur between the semiconductor memory apparatus and the chipset, the inversion operation can be performed only in a DBI mode by receiving the mode signal 'mode' which is generated from the mode register set, and cannot be performed in a normal mode.

SUMMARY

A semiconductor memory apparatus which performs a data bus inversion function in data input and output operations and a data input and output method thereof are described herein.

In one embodiment of the present invention, a semiconductor memory apparatus includes: an input data bus inversion unit configured to determine whether or not to invert a plurality of input data depending upon levels of the plurality of input data, and generate a plurality of conversion data; data input lines configured to transmit the plurality of conversion data; a data recovery unit configured to receive the plurality of conversion data and generate a plurality of storage data; and a memory bank configured to store the plurality of storage data.

In another embodiment of the present invention, a semiconductor memory apparatus includes: an input data bus inversion unit configured to determine whether or not to invert a plurality of input data depending upon logic levels of the plurality of input data, and generate a plurality of first conversion data; a first data recovery unit configured to generate a plurality of storage data by inverting or passing through the plurality of first conversion data; a memory bank configured to store the plurality of storage data; an output data bus inversion unit configured to determine whether or not to invert the plurality of storage data outputted from the memory bank depending upon logic levels of the plurality of storage data, and generate a plurality of second conversion data; and a second data recovery unit configured to receive the plurality of second conversion data and generate a plurality of output data.

In still another embodiment of the present invention, a data input method of a semiconductor memory apparatus includes the steps of: discriminating logic levels of a plurality of input data which are inputted from an outside, and generating a plurality of conversion data by inverting or passing through the plurality of input data depending upon a discrimination result; and converting the plurality of conversion data into data which are substantially the same as the plurality of input data, and storing the data in a memory bank.

In still another embodiment of the present invention, a data input and output method of a semiconductor memory apparatus includes the steps of: discriminating logic levels of a plurality of input data which are inputted from an outside, and generating a plurality of first conversion data by inverting or passing through the plurality of input data depending upon a discrimination result; converting the plurality of first conversion data into data which are substantially the same as the plurality of input data, and storing the data in a memory bank; discriminating logic levels of a plurality of data which are outputted from the memory bank, and generating a plurality of second conversion data by inverting or passing through the plurality of data outputted from the memory bank depending upon a discrimination result; and converting the plurality of second conversion data into data which are substantially the same as the plurality of input data, and outputting the data to data pads.

BRIEF DESCRIPTION OF THE DRAWINGS

Features, aspects, and embodiments are described in conjunction with the attached drawings, in which.

DETAILED DESCRIPTION

Hereinafter, a semiconductor memory apparatus and a data input and output method thereof according to the present invention will be described below with reference to the accompanying drawings through exemplary embodiments.

Figure 1:
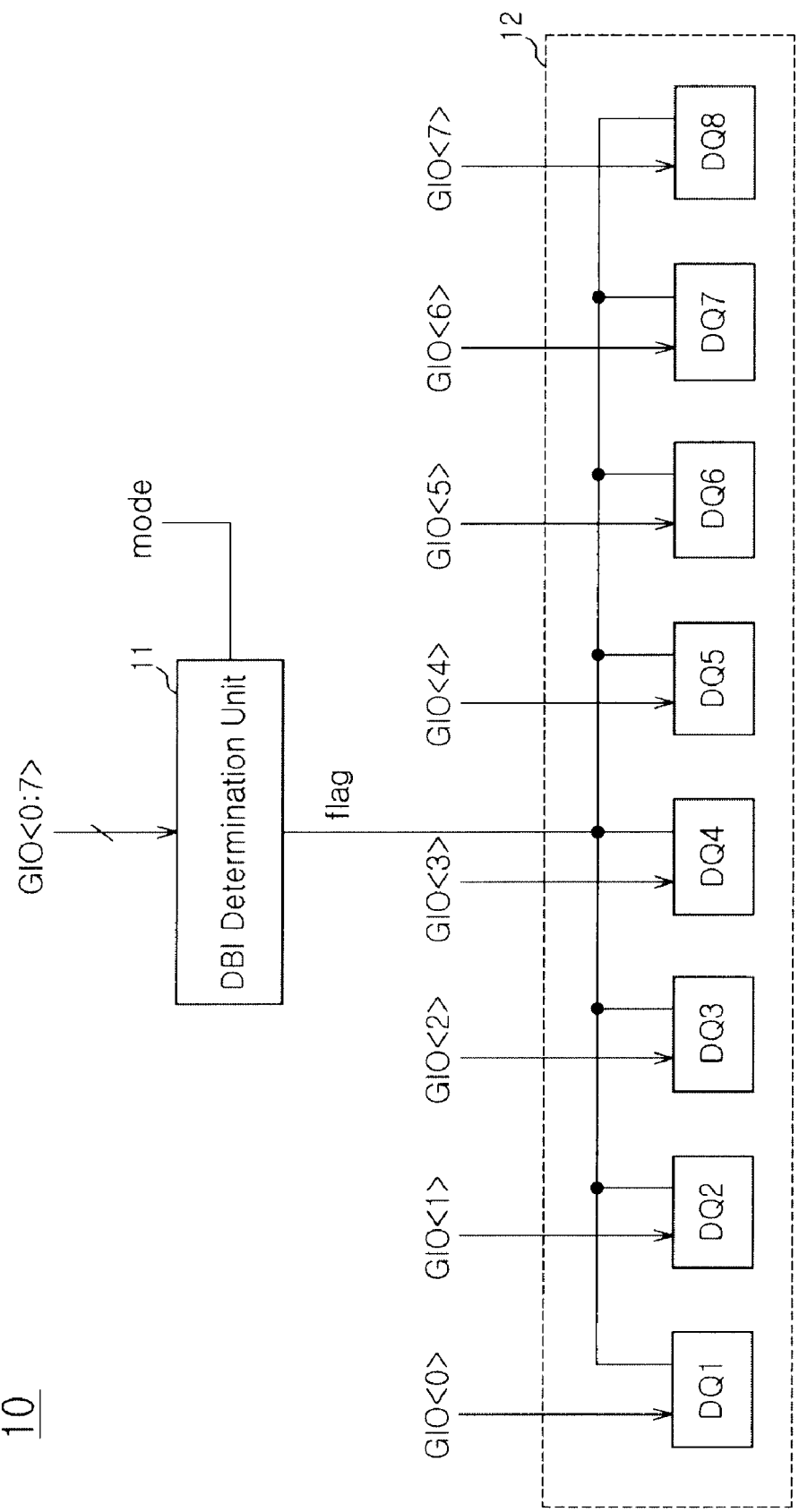
FIG. 1 is a block diagram schematically illustrating the configuration of a conventional semiconductor memory apparatus.
Figure 2:
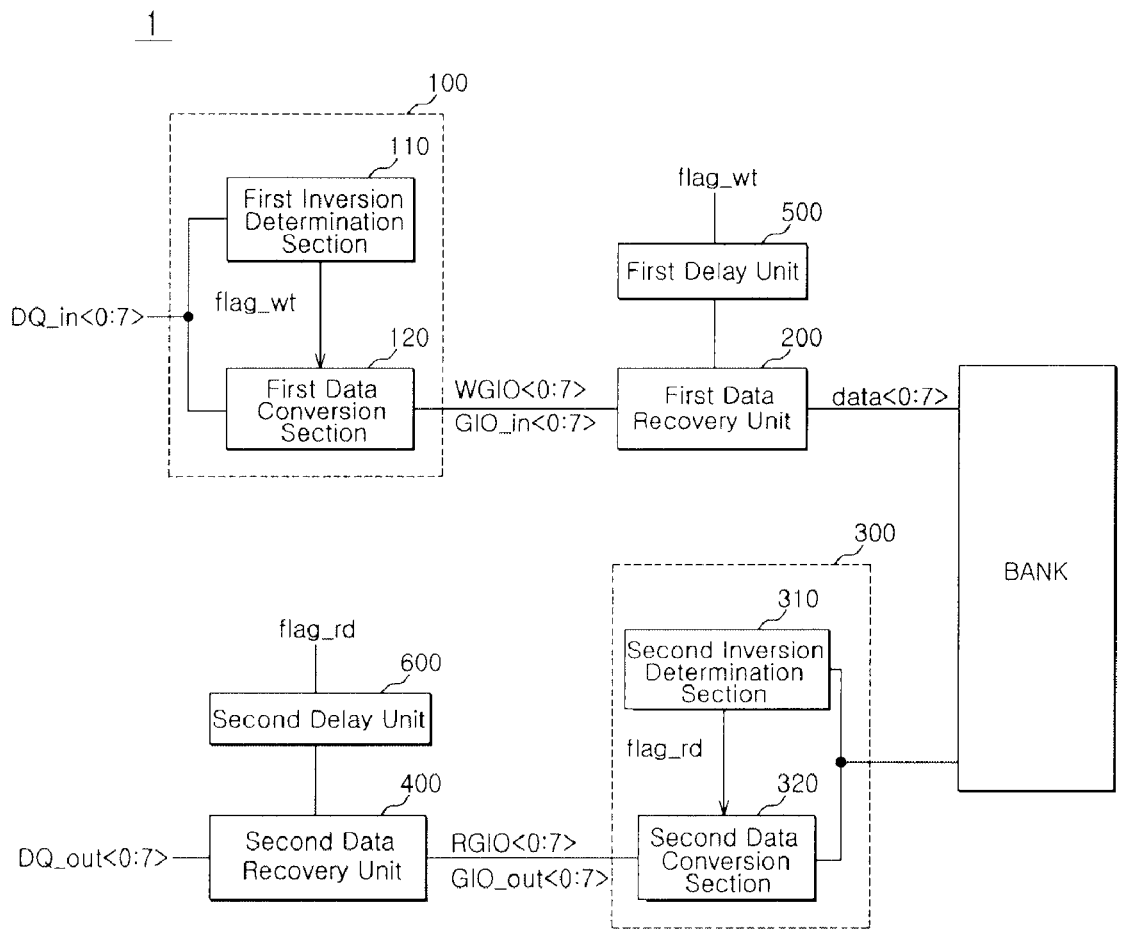
FIG. 2 is a block diagram schematically illustrating the configuration of a semiconductor memory apparatus in accordance with an embodiment of the present invention.

FIG. 2 is a block diagram schematically illustrating the configuration of a semiconductor memory apparatus in accordance with an embodiment of the present invention. Referring to FIG. 2, a semiconductor memory apparatus 1 includes an input data bus inversion unit 100, data input lines WGIO<0:7>, a first data recovery unit 200, a memory bank BANK, an output data bus inversion unit 300, data output lines RGIO<0:7>, and a second data recovery unit 400.

When the data input operation of the semiconductor memory apparatus 1 is performed, a plurality of input data DQ_in<0:7> are inputted to the semiconductor memory apparatus 1 from outside through data pads (not shown). The input data bus inversion unit 100 is configured to receive the plurality of input data DQ_in<0:7>, discriminate the logic levels of the plurality of input data DQ_in<0:7>, and determine whether or not to invert the plurality of input data DQ_in<0:7>. The input data bus inversion unit 100 discriminates the levels of the plurality of input data DQ_in<0:7>, and generates a plurality of first conversion data GIO_in<0:7> by inverting or passing through (i.e., transmitting) the plurality of input data DQ_in<0:7> depending upon a discrimination result. For example, the input data bus inversion unit 100 inverts the plurality of input data DQ_in<0:7>, that is, data on a plurality of data lines, and generates the plurality of first conversion data GIO_in<0:7> when a majority of the plurality of input data DQ_in<0:7> have a first level, and passes through the plurality of input data DQ_in<0:7> and generates the plurality of first conversion data GIO_in<0:7> when a majority of the plurality of input data DQ_in<0:7> have a second level. As used herein, the terminology "first level" may refer to, for example, a logic low level and the terminology "second level" may refer to a logic high level, while not being limited to such. That is to say, the first and second levels may vary depending upon the default level of the data input lines. Namely, if the data input lines are fixed to a logic low level and toggle when transmitting data of a logic high level, the first level may be a logic high level and the second level may be a logic low level. The logic level that produces the greatest current flow is used in making the decision of whether to invert. In other words, if the number of data bits having a logic level that will induce current flow is large, these data bits are inverted so that current consumption can be reduced. It is to be understood that the terminology "high logic level" (or "logic high level" or "high level") and "low logic level" (or "logic low level" or "low level") refers to, for example, voltage levels and/or voltage ranges that are predetermined to represent the high level or low level and not necessarily any specific values. Therefore it is to be understood that "high level" and "low level," which may also be referred to as "logic levels" for example, a "high logic level" and a "low logic level," respectively, may also be understood to correspond to logical or binary bit values, for example, where a "low logic level" corresponds to a logical "0" (which may correspond to an "OFF" condition) and a "high logic level" corresponds to a logical "1" (which may correspond to and "ON" condition) or vice versa depending on specific implementations in the various embodiments. Therefore, as used herein, "first level" and "second level" may refer to either a logical "0" or a logical "1." However, depending on the implementation, one of the levels will cause more current to flow than would the other level. Therefore the current producing level, in the various embodiments, will be inverted under certain conditions. For example, where a set of data bits has a majority of bits at the current producing level (which may be the high level or the low level) the data bits will be inverted in order to reduce the current flow. When the majority of data bits already have a majority of bits at the minimum current producing level, then the data bits will not be inverted and will be passed through, that is, transmitted.

The data input lines WGIO<0:7> serve as transmission paths of the plurality of first conversion data GIO_in<0:7>. The data input lines WGIO<0:7> connect the data pads which receive the input data DQ_in<0:7> inputted from the outside and the memory bank BANK in which the data are to be stored. In particular, in the embodiment of the present invention, the data input lines WGIO<0:7> connect the input data bus inversion unit 100 and the first data recovery unit 200. Accordingly, the plurality of first conversion data GIO_in<0:7> can be transmitted to the first data recovery unit 200 through the data input lines WGIO<0:7>.

The first data recovery unit 200 is configured to receive the is plurality of first conversion data GIO_in<0:7> and generate a plurality of storage data data<0:7>. The first data recovery unit 200 inverts or passes through the first conversion data GIO_in<0:7> depending upon whether the input data bus inversion unit 100 inverts or passes through the input data DQ_in<0:7>. In other words, the first data recovery unit 200 receives the first conversion data GIO_in<0:7> and generates the storage data data<0:7> which have substantially the same logic levels as the input data DQ_in<0:7>. Because some data errors may still occur due to, for example, noise infiltrating the data lines, some of the bits may not be transmitted to the memory bank BANK correctly. Therefore, the data logic levels are substantially the same as the input data logic levels in that there may be slight errors contained in the transmitted data. Further, the voltage levels corresponding to the logic levels may not be identical in different physical sections of the semiconductor apparatus. Therefore, although the voltages may differ, the data will still be interpreted as corresponding to the correct logic levels and therefore the logic levels are substantially the same.

The memory bank BANK includes a plurality of memory cells, and stores the plurality of storage data data<0:7> which are to generated by the first data recovery unit 200.

Through the configuration as mentioned above, the semiconductor memory apparatus 1 discriminates the logic levels of the input data DQ_in<0:7> when the input data DQ_in<0:7> are inputted from the outside, and transmits the input data DQ_in<0:7> is to the data input lines WGIO<0:7> by inverting or passing through the input data DQ_in<0:7>. As a consequence, current consumption that is likely to occur in the data input lines WGIO<0:7> due to toggling can be reduced by the various embodiments. Also, the storage data data<0:7> which have substantially the same levels as the levels of the input data DQ_in<0:7> can be generated by the first data recovery unit 200 and can be stored in the memory bank BANK.

When the data output operation of the semiconductor memory apparatus 1 is performed, the plurality of storage data data<0:7> which are stored in the memory bank BANK are outputted from the memory bank BANK. The output data bus inversion unit 300 is configured to receive the plurality of storage data data<0:7> which are outputted from the memory bank BANK, and discriminate the logic levels of the plurality of storage data data<0:7>. That is, the output data bus inversion unit 300 (and likewise the input data bus inversion unit 100) determines if a majority of data bits of the data are at the large current drawing level (i.e. "1" or "0") and, if yes, inverts the data such that the majority of data bits of the data are at the small current drawing level (i.e. "0" or "1"). In other words, if the majority of data logic levels will cause or require an excess current draw over the opposite (i.e. inverted) logic levels, then the data logic levels are inverted. The output data bus inversion unit 300 thus determines whether to invert the plurality of storage data data<0:7>, depending upon the result of discriminating the logic levels of the plurality of storage data data<0:7>. That is to say, the output data bus inversion unit 300 generates a plurality of second conversion data GIO_out<0:7> by inverting or passing through the plurality of storage data data<0:7> depending upon the discrimination result. For example, the output data bus inversion unit 300 inverts the plurality of storage data data<0:7> and generates the plurality of second conversion data GIO_out<0:7> when a majority of the plurality of storage data data<0:7> have a first level, and passes through the plurality of storage data data<0:7> and generates the plurality of second conversion data GIO_out<0:7> when a majority of the plurality of storage data data<0:7> have a second level.

The data output lines RGIO<0:7> serve as transmission paths of the plurality of second conversion data GIO_out<0:7>. The data output lines RGIO<0:7> connect the memory bank BANK in which the storage data data<0:7> are stored and the data pads which output output data DQ_out<0:7>. In particular, in the embodiment of the present invention, the data output lines RGIO<0:7> connect the output data bus inversion unit 300 and the second data recovery unit 400. While the data input lines WGIO<0:7> and the data output lines RGIO<0:7> are differently named for the sake of convenience in explanation, the data input lines WGIO<0:7> and the data output lines RGIO<0:7> actually constitute the same data transmission lines which simultaneously perform input and output operations, in the semiconductor memory apparatus 1. Therefore, in this sense, the data input and data output lines, that is, the data transmission lines, provide operative coupling of the input data bus inversion unit 100 to the first data recovery unit 200, which is further operatively coupled to the memory bank BANK. Furthermore, the memory bank BANK is operatively coupled to the output data bus inversion unit 300, which is further operatively coupled to the second data recovery unit 400. The terminology "operatively coupled" as used herein thus refers to coupling that enables operational and/or functional communication and relationships there-between and may include any intervening items necessary to enable such communication such as, for example, the data communication buses or any other necessary intervening items that one of ordinary skill would understand to be present. Also, it is to be understood that other intervening items may be present between "operatively coupled" items even though such other intervening items are not necessary to the functional communication facilitated by the operative coupling. For example, a data communication bus may provide data to several items along a pathway along which two or more items are operatively coupled, etc. Such operative coupling is shown generally in the figures described herein.

The second data recovery unit 400 is configured to receive the plurality of second conversion data GIO_out<0:7> and generate the plurality of output data DQ_out<0:7>. The second data recovery unit 400 inverts or passes through the second conversion data GIO_out<0:7> depending upon whether the output data bus is inversion unit 300 generates the second conversion data GIO_out<0:7> by inverting the storage data data<0:7> or generates the second conversion data GIO_out<0:7> by passing through the storage data data<0:7>. Accordingly, the second data recovery unit 400 generates the output data DQ_out<0:7> which have substantially the same logic levels as the storage data data<0:7>. As a result, all of the input data DQ_in<0:7>, the storage data data<0:7>, and the output data DQ_out<0:7> have substantially the same logic levels.

Through the configuration as mentioned above, even though the second conversion data GIO_out<0:7> which are generated as the storage data data<0:7> are inverted by the output data bus inversion unit 300 are transmitted through the data output lines RGIO<0:7>, the output data DQ_out<0:7> which have substantially the same logic levels as the storage data data<0:7> can be outputted through the data pads due to the presence of the second data recovery unit 400. Also, since the output data bus inversion unit 300 discriminates the logic levels of the storage data data<0:7> and outputs the second conversion data GIO_out<0:7> to the data output lines RGIO<0:7> by inverting or passing through the storage data data<0:7>, current consumption that is likely to occur in the data output lines RGIO<0:7> can be reduced. Furthermore, because the second data recovery unit 400 generates the output data DQ_out<0:7> by inverting or passing through the second conversion data GIO_out<0:7> depending upon whether or not the output data bus inversion unit 300 performs the inversion operation, the output data DQ_out<0:7> which have substantially the same levels as the input data DQ_in<0:7> can be generated.

Referring to FIG. 2, the input data bus inversion unit 100 includes a first inversion determination section 110 and a first data conversion section 120 operatively coupled to the first inversion determination section 110. The first inversion determination section 110 is configured to receive the plurality of input data DQ_in<0:7> and generate a first inversion signal flag_wt depending upon the logic levels of the plurality of input data DQ_in<0:7>. The first inversion determination section 110 enables the first inversion signal flag_wt when the majority of the plurality of input data DQ_in<0:7> have the first level, and disables the first inversion signal flag_wt when the majority of the plurality of input data DQ_in<0:7> are not the first level.

The first data conversion section 120 is configured to invert or pass through the plurality of input data DQ_in<0:7> in response to the first inversion signal flag_wt. The first data conversion section 120 inverts the plurality of input data DQ_in<0:7> and generates the plurality of first conversion data GIO_in<0:7> when the first inversion signal flag_wt is enabled, and passes through the plurality of input data DQ_in<0:7> and generates the plurality of first conversion data GIO_in<0:7> when the first inversion signal flag_wt is disabled.

The first data recovery unit 200 receives the first inversion signal flag_wt. The first data recovery unit 200 inverts or passes through the first conversion data GIO_in<0:7> in response to the first inversion signal flag_wt. The first data recovery unit 200 inverts the first conversion data GIO_in<0:7> and generates the storage data data<0:7> when the first inversion signal flag_wt is enabled. The first data recovery unit 200 passes through the first conversion data GIO_in<0:7> and generates the storage data data<0:7> when the first inversion signal flag_wt is disabled.

When the first inversion signal flag_wt is enabled, the input data bus inversion unit 100 inverts the input data DQ_in<0:7> and generates the first conversion data GIO_in<0:7>, and the first data recovery unit 200 inverts the first conversion data GIO_in<0:7> and generates the storage data data<0:7>. Conversely, when the first inversion signal flag_wt is disabled, the input data bus inversion unit 100 passes through the input data DQ_in<0:7> and generates the first conversion data GIO_in<0:7>, and the first data recovery unit 200 passes through the first conversion data GIO_in<0:7> and generates the storage data data<0:7>. Thus, the storage data data<0:7> can be data which have substantially the same levels as the input data DQ_in<0:7>.

The semiconductor memory apparatus 1 can further include a first delay unit 500, operatively coupled to the first data recovery unit 200, for delaying the first inversion signal flag_wt. The first delay unit 500 is configured to delay the first inversion signal flag_wt and provide a resultant signal to the first data recovery unit 200. Since the first conversion data GIO_in<0:7> are transmitted through the data input lines WGIO<0:7>, a time interval exists from when the first inversion determination section 110 generates the first inversion signal flag_wt to when the first data recovery unit 200 performs the inversion operation. Therefore, the first delay unit 500 is provided to compensate for the time interval.

Referring to FIG. 2, the output data bus inversion unit 300 includes a second inversion determination section 310 and a second data conversion section 320 which is operatively coupled to the second inversion determination section 310. The second inversion determination section 310 is configured to receive the plurality of storage data data<0:7> which are outputted from the memory bank BANK, and generate a second inversion signal flag_rd depending upon the levels of the plurality of storage data data<0:7>. Similar to the first inversion determination section 110, the second inversion determination section 310 enables the second inversion signal flag_rd when the majority of the plurality of storage data data<0:7> have the first level, and disables the second inversion signal flag_rd when the majority of the plurality of storage data data<0:7> have the second level.

The second data conversion section 320 is configured to invert or pass through the plurality of storage data data<0:7> in response to the second inversion signal flag_rd. The second data conversion section 320 inverts the plurality of storage data data<0:7> and generates the plurality of second conversion data GIO_out<0:7> when the second inversion signal flag_rd is enabled, and passes through the plurality of storage data data<0:7> and generates the plurality of second conversion data GIO_out<0:7> when the second inversion signal flag_rd is disabled.

The first and second inversion determination sections 110 and 310 can be configured in various ways, and, for example, may include the circuit disclosed in Korean Patent Application No. 10-2008-0133351, which is hereby incorporated herein by reference.

The second data recovery unit 400 receives the second inversion signal flag_rd. The second data recovery unit 400 inverts or passes through the second conversion data GIO_out<0:7> in response to the second inversion signal flag_rd, and generates the plurality of output data DQ_out<0:7>. The second data recovery unit 400 inverts the second conversion data GIO_out<0:7> and generates the output data DQ_out<0:7> when the second inversion signal flag_rd is enabled. The second data recovery unit 400 passes through the second conversion data GIO_out<0:7> and generates the output data DQ_out<0:7> when the second inversion signal flag_rd is disabled.

When the second inversion signal flag_rd is enabled, the output data bus inversion unit 300 inverts the storage data data<0:7> and generates the second conversion data GIO_out<0:7>, and the second data recovery unit 400 inverts the second conversion data GIO_out<0:7> and generates the output data DQ_out<0:7>. Conversely, when the second inversion signal flag_rd is disabled, the output data bus inversion unit 300 passes through the storage data data<0:7> and generates the second conversion data GIO_out<0:7>, and the second data recovery unit 400 passes through the second conversion data GIO_out<0:7> and generates the output data DQ_out<0:7>. Thus, the output data DQ_out<0:7> can have substantially the same levels as the storage data data<0:7> and the input data DQ_in<0:7>.

The semiconductor memory apparatus 1 can further include a second delay unit 600, operatively coupled to the second data recovery unit 400, for delaying the second inversion signal flag_rd. The second delay unit 600 is configured to delay the second inversion signal flag_rd and provide a resultant signal to the second data recovery unit 400. Since the second conversion data GIO_out<0:7> are transmitted through the data output lines RGIO<0:7>, a time interval exists from when the second inversion determination section 310 generates the second inversion signal flag_rd to when the second data recovery unit 400 performs the inversion operation. Therefore, the second delay unit 600 is provided to compensate for the time interval.

Figure 3:
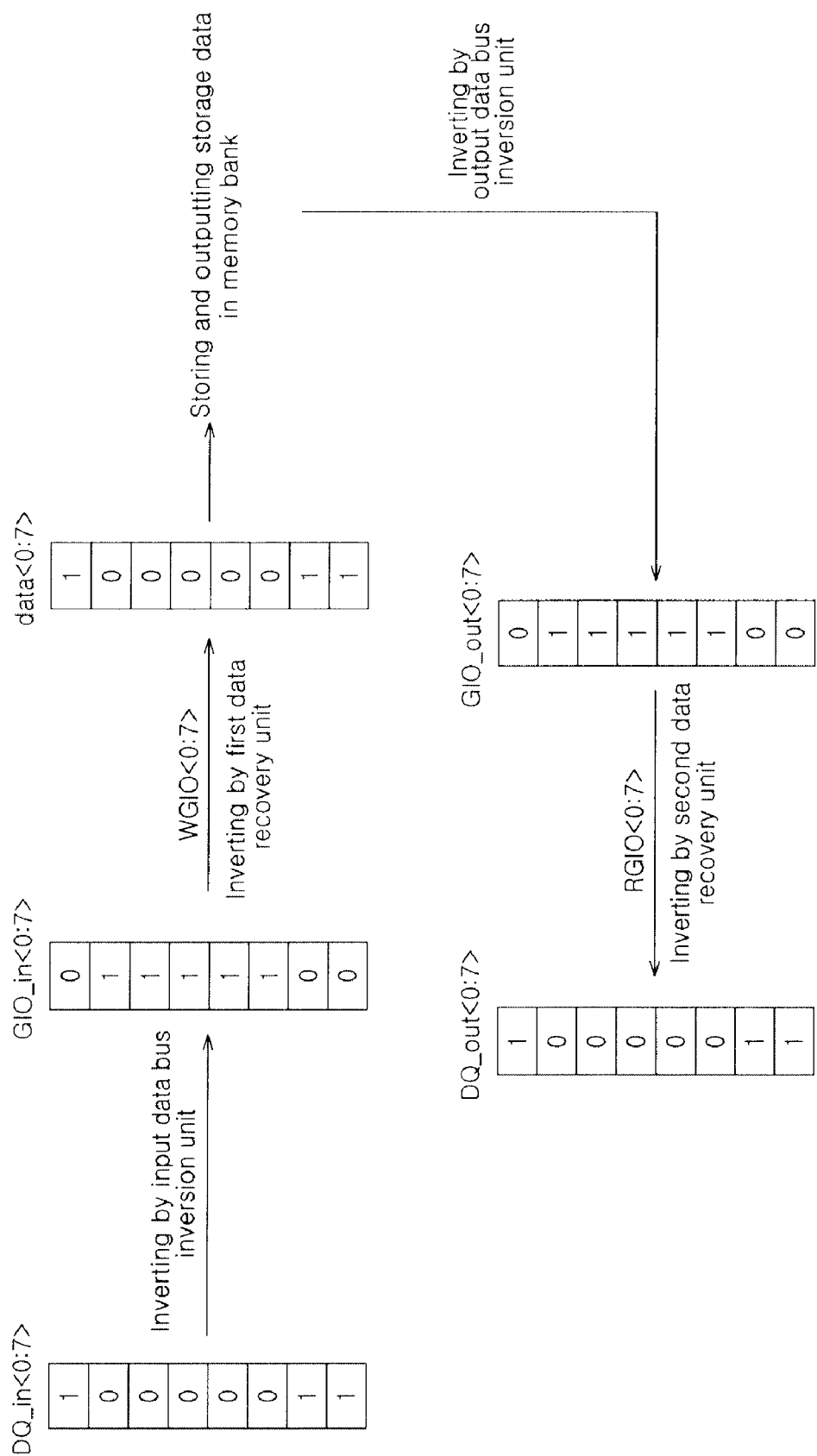
FIG. 3 is a diagram illustrating the input and output flow of data for explaining the operations of the semiconductor memory apparatus in accordance with the embodiment of the present invention.

FIG. 3 is a diagram illustrating the input and output flow of data for explaining the operations of the semiconductor memory apparatus in accordance with the embodiment of the present invention. Operations of the semiconductor memory apparatus 1 in accordance with the embodiment of the present invention will be described with reference to FIG. 3. When the data input operation of the semiconductor memory apparatus 1 is performed, the input data DQ_in<0:7> which have logic levels of '1, 0, 0, 0, 0, 0, 1, 1' are inputted through the data pads. The input data bus inversion unit 100 discriminates the levels of the input data DQ_in<0:7> and determines whether or not to invert the input data DQ_in<0:7>. Since five of total eight input data DQ_in<0:7> have the first level, that is, the logic low level, the input data bus inversion unit 100 inverts the input data DQ_in<0:7> and generates the first conversion data GIO_in<0:7> which have the levels of '0, 1, 1, 1, 1, 1, 0, 0'. The first conversion data GIO_in<0:7> are transmitted to the first data recovery unit 200 through the data input lines WGIO<0:7>. The first data recovery unit 200 inverts the first conversion data GIO_in<0:7> and generates the storage data data<0:7> which have the levels of '1, 0, 0, 0, 0, 0, 1, 1'. The storage data data<0:7> are stored in the memory bank BANK.

Thereafter, when the data output operation of the semiconductor memory apparatus 1 is performed, the storage data data<0:7> which are stored in the memory bank BANK are outputted. The output data bus inversion unit 300 discriminates the logic levels of the storage data data<0:7> and determines whether or not to invert the storage data data<0:7>. Since five of total eight storage data data<0:7> have the first level, that is, the logic low level, the output data bus inversion unit 300 inverts the storage data data<0:7> and generates the second conversion data GIO_out<0:7> which have the levels of '0, 1, 1, 1, 1, 1, 0, 0'. The second conversion data GIO_out<0:7> are transmitted to the second data recovery unit 400 through the data output lines RGIO<0:7>. The second data recovery unit 400 inverts the second conversion data GIO_out<0:7> and generates the output data DQ_out<0:7> which have the levels of '1, 0, 0, 0, 0, 0, 1, 1'. The output data DQ_out<0:7> can be outputted to the outside of the semiconductor memory apparatus 1 through the data pads. Accordingly, the semiconductor memory apparatus 1 of the embodiments can reduce the current consumption in the data input and output lines WGIO<0:7> and RGIO<0:7> during the data input and output operations while being capable of outputting the output data DQ_out<0:7> which have substantially the same levels as the input data DQ_in<0:7>. This applies in the same manner even in the case where the input and output data bus inversion units 100 and 300 do not perform the inversion operations.

Figure 4:
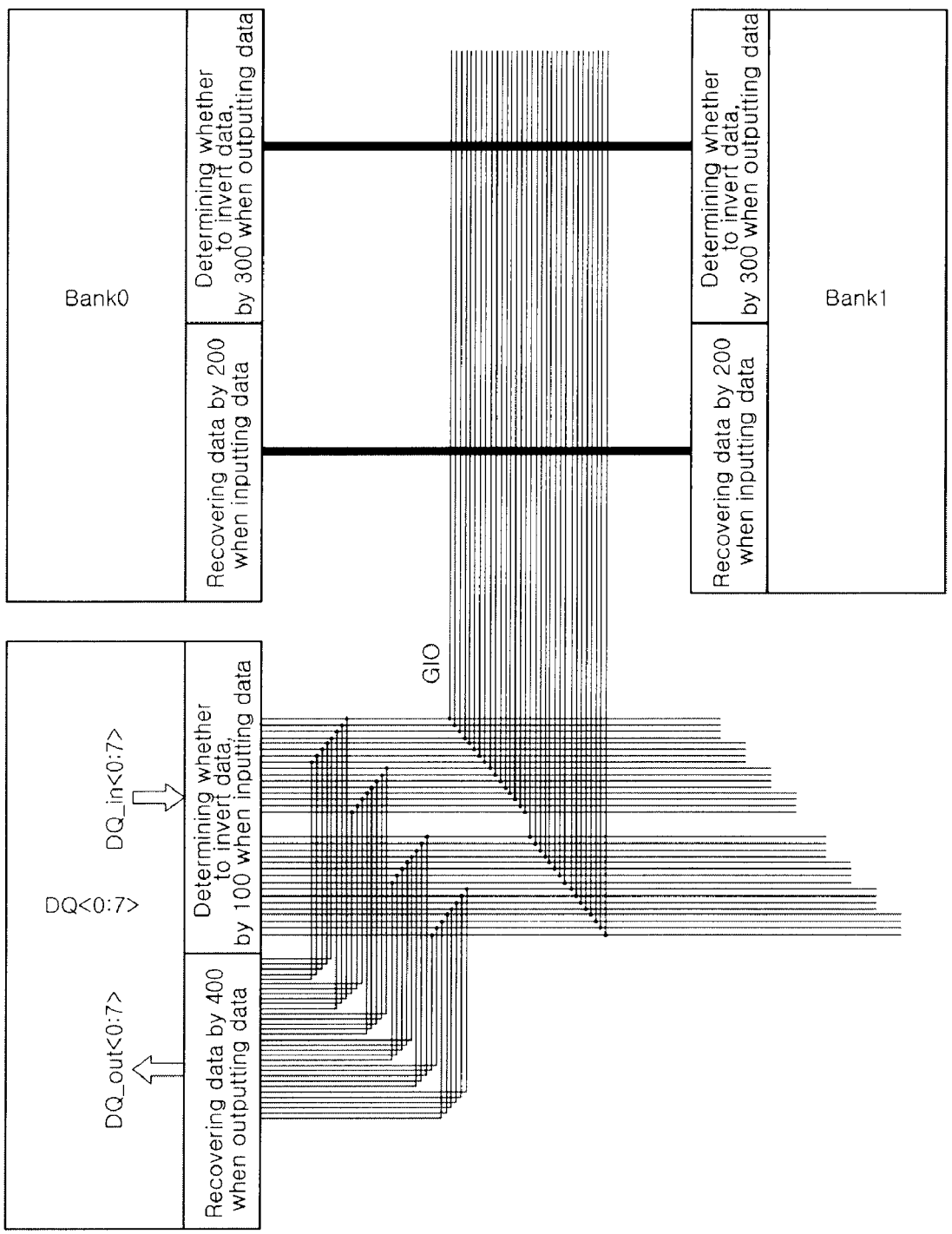
FIG. 4 is a diagram illustrating a state in which the first and second data bus inversion units shown in FIG. 2 are disposed in the semiconductor memory apparatus.

FIG. 4 is a diagram schematically illustrating the layout of the semiconductor memory apparatus in accordance with the embodiment of the present invention. Referring to FIG. 4, data pads DQ<0:7> are disposed in a peripheral region between first and second memory banks BANK0 and BANK1. When inputting data, if the input data DQ_in<0:7> are inputted through the data pads DQ<0:7> from the outside of the semiconductor memory apparatus 1, the input data DQ_in<0:7> are outputted to the data input and output lines GIO by being inverted or passed through by the input data bus inversion unit 100. As aforementioned above, since the is data input lines WGIO<0:7> and the data output lines RGIO<0:7> constitute the same data transmission lines, the data input lines WGIO<0:7> and the data output lines RGIO<0:7> are shown as the data input and output lines GIO in FIG. 4. The input data bus inversion unit 100 may be disposed adjacent to the data pads DQ<0:7>. This is because current consumption that is likely to occur in the data input and output lines GIO can be reduced when whether or not to invert the input data DQ_in<0:7> is determined depending upon the logic levels of the input data DQ_in<0:7> and resultant data are transmitted to the data input and output lines GIO as soon as the plurality of input data DQ_in<0:7> are inputted through the data pads DQ<0:7>.

The first data recovery unit 200 is disposed adjacent to the memory banks BANK0 and BANK1. The first data recovery unit 200 transmits the data transmitted through the data input and output lines GIO to the memory banks BANK0 and BANK1 by inverting or passing through the data. Accordingly, the first data recovery unit 200 ensures that the data which have substantially the same levels as the input data DQ_in<0:7> can be stored in the memory banks BANK0 and BANK1.

When outputting data, the output data bus inversion unit 300 inverts or passes through the data outputted from the memory banks BANK0 and BANK1 and transmits resultant data to the data input and output lines GIO. The output data bus inversion unit 300 may be disposed adjacent to the first and second memory banks BANK0 and BANK1. Also, specifically, if the data stored in the first and second memory banks BANK0 and BANK1 are loaded on the data input and output lines GIO after being collected in a cross area, the output data bus inversion unit 300 may be disposed in the cross area. The cross area indicates a zone where regions, in which the row-related control circuits and column-related control circuits of the semiconductor memory apparatus are positioned, cross with each other. This is because current consumption that is likely to occur in the data input and output lines GIO can be reduced when whether or not to invert the data outputted from the memory banks BANK0 and BANK1 is determined depending upon the logic levels of the data and resultant data are transmitted to the data input and output lines GIO as soon as the data are inputted to the output data bus inversion unit 300.

The second data recovery unit 400 is disposed adjacent to the data pads DQ<0:7>. The second data recovery unit 400 transmits the data transmitted through the data input and output lines GIO to the data pads DQ<0:7> by inverting or passing through the data. Accordingly, the second data recovery unit 400 can output the output data DQ_out<0:7> which have substantially the same levels as the data outputted from the memory banks BANK0 and BANK1, to the data pads DQ<0:7>. The data pads DQ<0:7> output the output data DQ_out<0:7> outputted from the second data recovery unit 400, to the outside of the semiconductor memory apparatus 1. As a result, the semiconductor memory apparatus 1 of the embodiments can reduce the current consumption of the data input and output lines by inverting or passing through the levels of the input data while storing the data having the same levels as the input data in the memory banks. Moreover, the semiconductor memory apparatus 1 of the embodiments can reduce the current consumption of the data input and output lines by inverting or passing through the levels of the data stored in the memory banks while outputting the data having the same levels as the data stored in the memory banks, through the data pads.

While certain embodiments have been described above, it will be understood to those skilled in the art that the embodiments described are by way of example only. Accordingly, the semiconductor memory apparatus and the data input and output method thereof described herein should not be limited based on the described embodiments. Rather, the semiconductor memory apparatus and the data input and output method thereof described herein should only be limited in light of the claims that follow when taken in conjunction with the above description and accompanying drawings.

What is claimed is:

1. A semiconductor memory apparatus comprising:
   an input data bus inversion unit configured to invert a plurality of input data in response to discriminated levels of the input data, and generate a plurality of conversion data; and
   a data recovery unit, operatively coupled to the input data bus inversion unit, configured to receive the plurality of conversion data and generate a plurality of storage data therefrom, wherein the information content of the plurality of storage data is same as the information content of the plurality of input data.

2. The semiconductor memory apparatus according to claim 1, wherein the input data bus inversion unit comprises:
   an inversion determination section configured to discriminate logic levels of the plurality of input data and generate an inversion signal; and
   a data conversion section, operatively coupled to the inversion determination section, configured to invert the plurality of input data in response to the inversion signal, and generate the plurality of conversion data.

3. The semiconductor memory apparatus according to claim 1, wherein the data recovery unit is configured to receive the plurality of conversion data and generate the plurality of storage data having substantially the same logic levels as the plurality of input data.

4. The semiconductor memory apparatus according to claim 2, wherein the data recovery unit is configured to generate the plurality of storage data by inverting the plurality of conversion data in response to the inversion signal.

5. The semiconductor memory apparatus according to claim 1, wherein the input data bus inversion unit is operatively coupled to a memory bank by a plurality of data input lines.

6. A semiconductor memory apparatus comprising:
an input data bus inversion unit configured to determine that a majority of logic levels of a plurality of input data will require excess current and, in response, invert of the plurality of input data to generate a plurality of first conversion data;
a first data recovery unit, operatively coupled to the input data bus inversion unit, configured to generate a plurality of storage data by inverting the plurality of first conversion data, wherein the information content of the plurality of storage data is same as the information content of the plurality of input data;
a memory bank, operatively coupled to the first data recovery unit, configured to store the plurality of storage data;
an output data bus inversion unit, operatively coupled to the memory bank, configured to determine that a majority of logic levels of the plurality of storage data outputted from the memory bank will require excess current and, in response, invert the plurality of storage data, and generate a plurality of second conversion data; and
a second data recovery unit, operatively coupled to the output data bus inversion unit, configured to receive the plurality of second conversion data and generate a plurality of output data, wherein the information content of the plurality of storage data is same as the information content of the plurality of output data.

7. The semiconductor memory apparatus according to claim 6, wherein the input data bus inversion unit comprises:
a first inversion determination section configured to discriminate the logic levels of the plurality of input data and generate a first inversion signal; and
a first data conversion section, operatively coupled to the first inversion determination section, configured to invert the plurality of input data in response to the first inversion signal, and generate the plurality of first conversion data.

8. The semiconductor memory apparatus according to claim 6, wherein the first data recovery unit is configured to receive the plurality of first conversion data and generate the plurality of storage data having substantially the same logic levels as the plurality of input data.

9. The semiconductor memory apparatus according to claim 7, wherein the first data recovery unit is configured to generate the plurality of storage data by inverting the plurality of first conversion data in response to the first inversion signal.

10. The semiconductor memory apparatus according to claim 7, further comprising:
a first delay unit, operatively coupled to the first data recovery unit, configured to delay the first inversion signal and provide a resultant signal to the first data recovery unit.

11. The semiconductor memory apparatus according to claim 9, wherein the output data bus inversion unit comprises:
a second inversion determination section configured to discriminate the logic levels of the plurality of storage data and generate a second inversion signal; and
a second data conversion section, operatively coupled to the second inversion determination section, configured to invert the plurality of storage data in response to the second inversion signal, and generate the plurality of second conversion data.

12. The semiconductor memory apparatus according to claim 6, wherein the second data recovery unit is configured to receive the second conversion data and generate the output data having substantially the same logic levels as the storage data.

13. The semiconductor memory apparatus according to claim 11, wherein the second data recovery unit is configured to generate the plurality of output data by inverting the plurality of second conversion data in response to the second inversion signal.

14. The semiconductor memory apparatus according to claim 11, further comprising:
a second delay unit, operatively coupled to the second data recovery unit, configured to delay the second inversion signal and provide a resultant signal to the second data recovery unit.

15. The semiconductor memory apparatus according to claim 6, further comprising:
data input and output lines operatively coupling the input data bus inversion unit and the first data recovery unit and operatively coupling the output data bus inversion unit and the second data recovery unit, and wherein the data input and output lines transmit the first and second conversion data.

16. A data input method of a semiconductor memory apparatus, comprising the steps of:
discriminating logic levels of a plurality of input data to obtain a discrimination result;
generating a plurality of conversion data by inverting the plurality of input data based on the discrimination result; and
converting the plurality of conversion data into data substantially the same as the plurality of input data, and storing the data in a memory bank, wherein the information content of the plurality of storage data is same as the information content of the plurality of input data.

17. The method according to claim 16, wherein, the step of generating the plurality of conversion data includes inverting the plurality of input data when a majority of the plurality of input data have a first level.

18. A data input and output method of a semiconductor memory apparatus, comprising the steps of:
discriminating logic levels of a plurality of input data to obtain a discrimination result;
generating a plurality of first conversion data by inverting the plurality of input data based on the discrimination result;
converting the plurality of first conversion data into data substantially the same as the plurality of input data, and storing the data in a memory bank, wherein the information content of the plurality of storage data is same as the information content of the plurality of input data;
discriminating logic levels of a plurality of data outputted from the memory bank to obtain an output discrimination result;
generating a plurality of second conversion data by inverting the plurality of data outputted from the memory bank based on the output discrimination result; and
converting the plurality of second conversion data into data which are substantially the same as the plurality of input data, wherein the information content of the plurality of storage data is same as the information content of the plurality of output data.

19. The method according to claim 18, wherein the step of generating the plurality of first conversion data includes inverting the plurality of input data when a majority of the plurality of input data have a first level.

20. The method according to claim 19, wherein the step of generating the plurality of second conversion data includes inverting the plurality of data outputted from the memory bank when a majority of the data outputted from the memory bank have the first level.

* * * * *